United States Patent
Rhodes

(10) Patent No.: US 6,654,057 B1
(45) Date of Patent: Nov. 25, 2003

(54) ACTIVE PIXEL SENSOR WITH A DIAGONAL ACTIVE AREA

(75) Inventor: Howard E. Rhodes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/335,182

(22) Filed: Jun. 17, 1999

(51) Int. Cl.[7] .................. H04N 5/335; H01L 27/00; H01L 31/062
(52) U.S. Cl. .................. 348/294; 348/308; 348/316; 250/208.1; 257/291; 257/292
(58) Field of Search .................. 348/294, 298, 348/311, 315, 308, 291, 293, 316, 319; 250/208.1; 257/291, 292

(56) References Cited

U.S. PATENT DOCUMENTS

| | | | |
|---|---|---|---|
| 4,081,841 A | * 3/1978 | Ochi et al. ............. 348/315 |
| 4,262,297 A | 4/1981 | Partridge | |
| 4,309,624 A | 1/1982 | Hynecek et al. | |
| 4,319,261 A | 3/1982 | Kub | |
| 4,374,700 A | 2/1983 | Scott et al. | |
| 4,700,459 A | 10/1987 | Peek | |
| 5,151,385 A | 9/1992 | Yamamoto et al. | |
| 5,194,724 A | * 3/1993 | Sekine ................ 348/316 |
| 5,319,604 A | 6/1994 | Imondi et al. | |
| 5,393,997 A | 2/1995 | Fukusho et al. | |
| 5,449,908 A | * 9/1995 | Wadsworth et al. ........ 250/332 |
| 5,461,425 A | 10/1995 | Fowler et al. | |
| 5,471,515 A | 11/1995 | Fossum et al. | |
| 5,506,429 A | 4/1996 | Tanaka et al. | |
| 5,541,402 A | 7/1996 | Ackland et al. | |
| 5,576,763 A | 11/1996 | Ackland et al. | |
| 5,587,738 A | * 12/1996 | Shinohara ............. 348/308 |
| 5,608,243 A | 3/1997 | Chi et al. | |
| 5,612,799 A | 3/1997 | Yamazaki et al. | |
| 5,614,744 A | 3/1997 | Merrill | |
| 5,625,210 A | 4/1997 | Lee et al. | |
| 5,705,846 A | 1/1998 | Merrill | |
| 5,708,263 A | 1/1998 | Wong | |
| 5,721,422 A | * 2/1998 | Bird ................. 250/208.1 |
| 5,747,840 A | 5/1998 | Merrill | |
| 5,757,045 A | 5/1998 | Tsai et al. | |
| 5,760,458 A | 6/1998 | Bergemont et al. | |
| 5,955,753 A | * 9/1999 | Takahashi ............ 257/292 |
| 6,040,569 A | * 3/2000 | Hynecek ............. 250/208.1 |
| 6,118,115 A | * 9/2000 | Kozuka et al. ......... 250/208.1 |
| 6,140,630 A | * 10/2000 | Rhodes .............. 250/208.1 |
| 6,141,050 A | * 10/2000 | Ackland et al. ......... 348/308 |
| 6,300,977 B1 | * 10/2001 | Waechter et al. ........ 348/300 |

OTHER PUBLICATIONS

Dickinson, A., et al., *A 256x256 CMOS Active Pixel Image Sensor with Motion Detection*, 1995 IEEE International Solid–State Circuits Conference, pps. 226–227.

Dickinson, A., et al., *Standard CMOS Active Pixel Image Sensors for Multimedia Applications*, Proceedings of Sixteenth Conference on Advanced Research in VLSI, Mar. 27–29, 1995, pps. 214–224.

Eid, E–S., et al., *A 256x256 CMOS Active Pixel Image Sensor*, Proc. SPIE vol. 2415, Apr. 1995, pps. 265–275.

(List continued on next page.)

Primary Examiner—Wendy R. Garber
Assistant Examiner—Lin Ye
(74) Attorney, Agent, or Firm—Dickstein Shapiro Morin & Oshinsky LLP

(57) ABSTRACT

An imaging device formed as a CMOS semiconductor integrated circuit having two adjacent pixels in a row connected to a common column line. By having adjacent pixels of a row share column lines, the CMOS imager circuit eliminates half the column lines of a traditional imager allowing the fabrication of a smaller imager. The imaging device also maybe fabricated to have a diagonal active area to facilitate contact of two adjacent pixels with the single column line and allow linear row select lines, reset lines and column lines.

55 Claims, 8 Drawing Sheets

OTHER PUBLICATIONS

Fossum, E., *CMOS Image Sensors: Electronic Camera On A Chip*, 1995 IEEE, pps. 17–25.

Fossum, E., et al., *IEDM A 37×28mm2 600k–Pixel CMOS APS Dental X–Ray Camera–on–a–Chip with Self–Triggered Readout*, 1998 IEEE International Solid–State Circuits Conference, pps. 172–173.

Fossum, E., *Low Power Camera–on–a–Chip Using CMOS Active Pixel Sensor Technology*, 1995 IEEE, pps. 74–77.

Fossum, E., *Architectures for focal plane image processing*, Optical Engineering, vol. 28, No. 8, Aug. 1989, pps. 865–871.

Janesick, J., et al., *New advancements in charge–coupled device technology—sub–electron noise and 4096×4096 pixel CCDs*, Proc. SPIE vol. 1242, 1990, pps. 223–237.

Kemeny, S.E., et al., *Update on focal–plane image processing research*, Proc. SPIE vol. 1447, 1991, pps. 243–250.

Mendis, S., et al., *CMOS Active Pixel Image Sensor*, IEEE Transactions on Electron Devices, vol. 41, No. 3, Mar. 1994, pps. 452–453.

Mendis, S.K., et al., *A 128×128 CMOS Active Pixel Image Sensor for Highly Integrated Imaging Systems*, 1993 IEEE, pps. 583–586.

Mendis, S.K., et al., *CMOS Active Pixel Image Sensors for Highly Integrated Imaging Systems*, IEEE Journal of Solid–State Circuits, vol. 32, No. 2, Feb. 1997, pps. 187–197.

Mendis, S.K., et al., *Design of a Low–Light–Level Image Sensor with On–Chip Sigma–Delta Analog–to–Digital Conversion*, Proc. SPIE vol. 1900, Jul. 1993, pps. 31–39.

Mendis, S.K., et al., *Low–Light–Level Image Sensor with On–Chip Signal Processing*, Proc. SPIE vol. 1952, Nov. 1993, pps. 23–33.

Mendis, S.K., et al., *Progress In CMOS Active Pixel Image Sensors*, Proc. SPIE vol. 2172, May 1994, pps. 19–29.

Nakamura, J., et al., *CMOS Active Pixel Image Sensor with Simple Floating Gate Pixels*, IEEE Transactions on Electron Devices, vol. 42, No. 9, Sep. 1995, pps. 1693–1694.

Nixon, R.H., et al., *256×256 CMOS Active Pixel Sensor Camera–on–a–Chip*, IEEE Journal of Solid–State Circuits, vol. 31, No. 12, Dec. 1996, pps. 2046–2050.

Nixon, R.H., et al., *256×256 CMOS Active Pixel Sensor Camera–on–a–Chip*, 1996 IEEE International Solid–State Circuits Conference, pps. 178–179.

Panicacci, R., et al., *Programmable multiresolution CMOS active pixel sensor*, Proc. SPIE vol. 2654, Mar. 1996, pps. 72–79.

Panicacci, R.A., et al., *128Mb/s Multiport CMOS Binary Active–Pixel Image Sensor*, 1996 IEEE International Solid–State Circuit Conference, pps. 100–101.

Yadid–Pecht, O., et al., *CMOS Active Pixel Sensor Star Tracker with Regional Electronic Shutter*, IEEE Journal of Solid–State Circuits, vol. 32, No. 2, Feb. 1997, pps. 285–288.

Yadid–Pecht, O., et al., *Wide dynamic range APS star tracker*, Proc. SPIE vol. 2654, Mar. 1996, pps. 82–92.

Zarnowski, J., et al., *Imaging options expand with CMOS technology*, Laser Focus World, Jun. 1997, pps. 125–130.

Zhou, Z., et al., *A Cmos Imager with On–Chip Variable Resolution for Light–Adaptive Imaging*, 1998 IEEE International Solid–State Circuits Conference, pps. 174–175.

Zhou, Z., et al., *A Digital CMOS Active Pixel Image Sensor For Multimedia Applications*, Proc. SPIE vol. 2894, Sep. 1996, pps. 282–288.

* cited by examiner

ACTIVE PIXEL SENSOR WITH A DIAGONAL ACTIVE AREA

FIELD OF THE INVENTION

The invention relates generally to improved semiconductor imaging devices and in particular to a silicon imaging device which can be fabricated using a standard CMOS process. Particularly, the invention relates to CMOS imager having orthogonal row and column lines and a plurality of pixel sensors each having a diagonal active area. The invention further relates to a CMOS imager having two adjacent pixels in the same row of a pixel array connected to a shared column line.

DESCRIPTION OF THE RELATED ART

There are a number of different types of semiconductor-based imagers, including charge coupled devices (CCDs), photodiode arrays, charge injection devices and hybrid focal plane arrays. CCDs are often employed for image acquisition and enjoy a number of advantages which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there has been some attempts to integrate on-chip signal processing with the CCD array, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel during charge transfer which also results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, photoconductor or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12) pp. 2046–2050, 1996; Mendis et al, "CMOS Active Pixel Image Sensors," IEEE Transactions on Electron Devices, Vol. 41(3) pp. 452–453, 1994 as well as U.S. Pat. No. 5,708,263 and U.S. Pat. No. 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an MxN array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of, for example, Si, SiGe, Ge, and GaAs. Typically the entire substrate 16 is p-type doped silicon substrate and may contain a surface p-well 20 (with layer 18 omitted), but many other options are possible, such as, for example p on p-substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photbgate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below. A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source VDD, e.g., 5 volts. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source VDD and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source VSS, e.g. 0 volts. Transistor 39 is kept on by a signal VLN applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of capacitor 64 is connected to a source voltage VSS. The upper side of the capacitor 64 is also connected to the gate of a p-channel output transistor 66. The drain of the output transistor 66 is connected through a column select transistor 68 to a signal sample output node VOUTS and through a load transistor 70 to the voltage supply VDD. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage VSS. The upper side of the capacitor 74 is also connected to the gate of a p-channel output transistor 76. The drain of the output transistor 76 is connected through a p-channel column select transistor 78 to a reset sample output node VOUTR and through a load transistor 80 to the supply voltage VDD. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages VOUTR and VOUTS of the readout circuit 60. These voltages are then subtracted (VOUTS-VOUTR) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in the manner shown by element 14 of FIG. 1. Pixel array 200 comprises a plurality of pixels arranged in a predetermined number of columns and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of photodetector circuit 14 of the FIG. 1 CMOS imager. The photogate signal PG is nominally set to 5V and pulsed from 5V to 0V during integration. The reset signal RST is nominally set at 2.5V. As can be seen from the figure, the process is begun at time $t_0$ by briefly pulsing reset voltage RST to 5V. The RST voltage, which is applied to the gate 32 of reset transistor 31, causes transistor 31 to turn on and the floating diffusion node 30 to charge to the VDD voltage present at n+ region 34 (less the voltage drop Vth of transistor 31). This resets the floating diffusion node 30 to a predetermined voltage (VDD-Vth). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26. A transfer gate voltage TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 1994; Mendis et al., "CMOS Active Pixel Image Sensors for Highly Integrated Imaging Systems," IEEE Journal of Solid State Circuits, Vol. 32(2), 1997; and Eric R, Fossum, "CMOS Image Sensors: Electronic Camera on a Chip," IEDM Vol. 95 pages 17–25 (1995) as well as other publications. These references are incorporated herein by reference.

Prior CMOS imagers had a respective column line attached to every pixel in the row. By having a column line for each pixel in the row, the row select (ROW), reset (RST) and transfer (TX) lines of the prior imagers had to be routed in a manner where such lines are not straight and, in fact, each have substantial perpendicular conductive segments 811, 816, 851 respectively, as shown in FIG. 7. The large number of perpendicular conductor segments makes fabrication of a pixel array complicated and it is difficult to maintain the required spacing for the numerous conductors and their perpendicular segments. Additionally, CMOS imagers having such a considerable number of non-linear contact paths results in increased materials costs and a large pixel size. It would be desirable to shrink pixel size if possible to reduce the size of the conductors in order to increase the size of the photosensitive area "active area" of a pixel.

SUMMARY OF THE INVENTION

The present invention provides an imaging device formed as a CMOS integrated circuit using a standard CMOS process fabricated such that two adjacent pixels in a selected row share a single column line. By sharing column lines, the pixel array can be fabricated using fewer conductors which permits the cells to have larger photosensitive areas. Additionally, by having two adjacent pixels sharing a single column line the imager will be more efficiently fabricated since the design of the present invention eliminates half of the usually required metal column line contacts.

The present invention seeks to reduce the number of required conductors having perpendicular segments while providing orthogonal row and column conductors for the pixel array. In one implementation of the invention the shared column lines and straight contact lines are achieved by formulating a diagonal active area for each pixel. The fabrication of the diagonal active area allows the row select lines and column select and reset lines to be linear in the circuit (when viewed from above). The diagonal active area implementation of the present invention also allows displacement of the metal Vout lines from the VDD contacts so that the Vout lines can be straight.

The above and other advantages and features of the invention will be more clearly understood from the following detailed description which is provided in connection with the accompanying drawings.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

Figure 4:
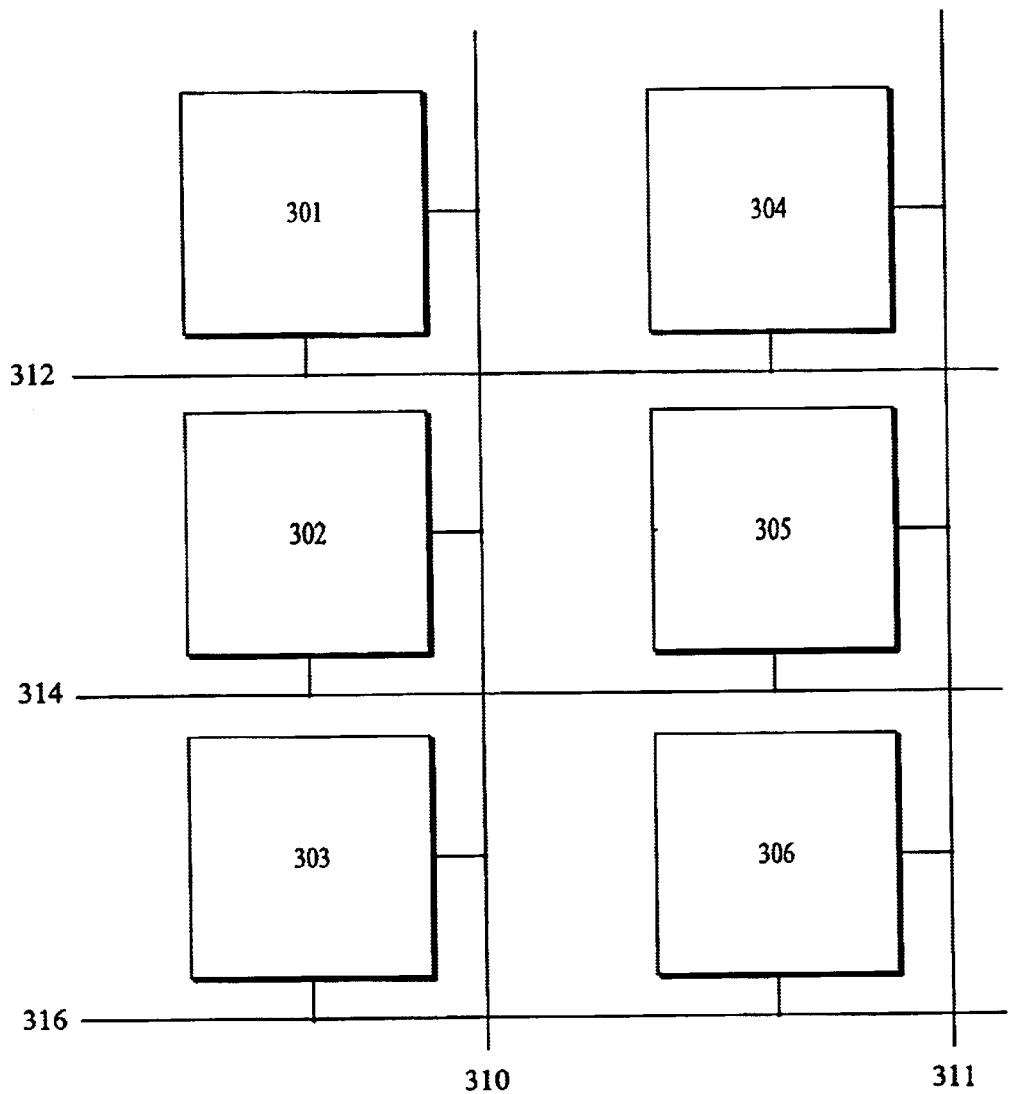
FIG. 4 shows a pixel layout showing a 2×3 pixel layout according to the prior art.

The present invention will now be described with reference to the figures. Referring now to FIG. 4. This figure shows a 2×3 pixel layout according to the prior art. Pixels 301, 302 and 303 contact column line 310 and row lines 312, 314 and 316. Pixels 304, 305 and 306 contact column line 311 and row lines 312, 314 and 316.

Figure 5:
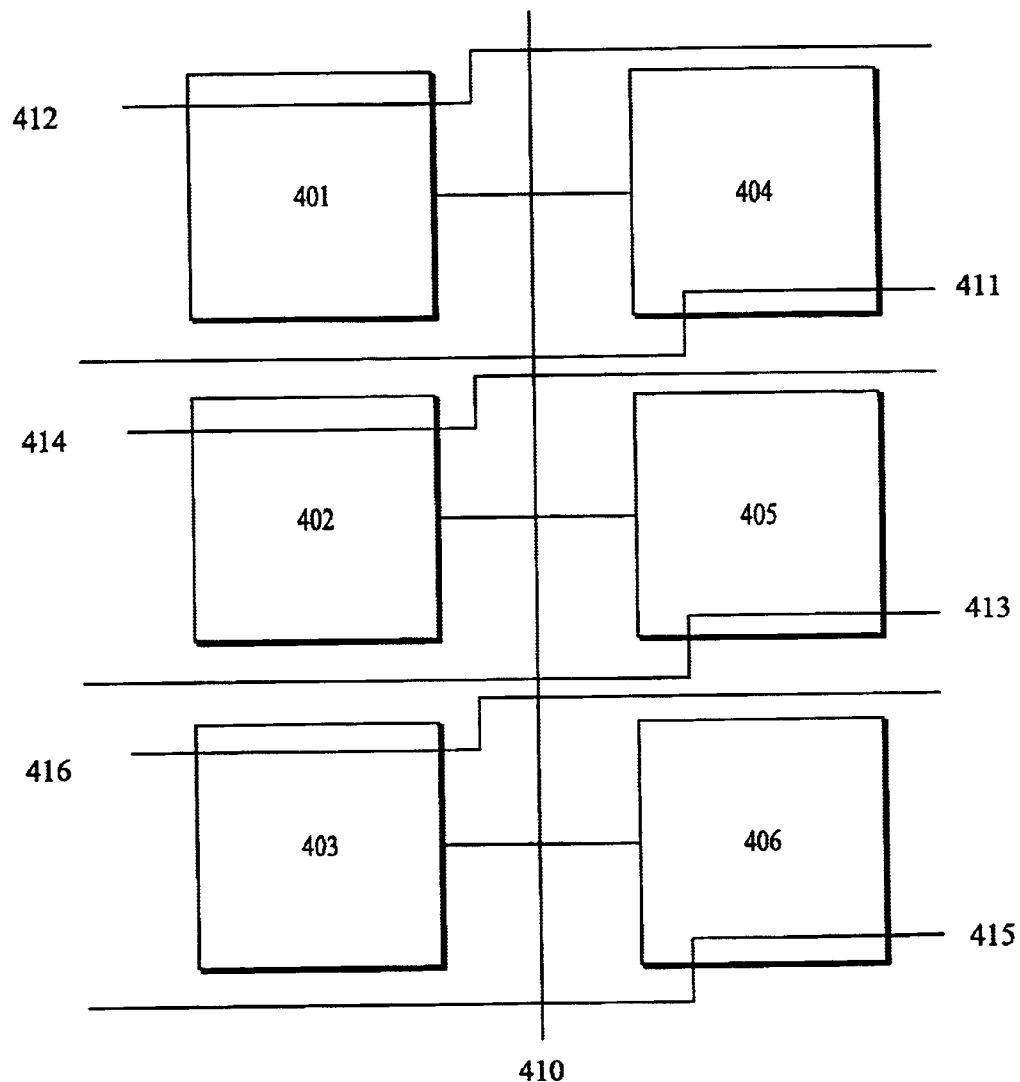
FIG. 5 shows a pixel layout showing a 2×3 pixel layout according to one embodiment of the present invention.

FIG. 5 illustrates a similar 2×3 pixel layout according to one embodiment of the present invention. As illustrated in the figure, pixels 401, 402, 403, 404, 405 and 406 all connect with column line 410. Pixel 401 connects with even row line 412. Pixel 402 connects with even row line 414. Pixel 403 connects with even row line 416. Pixel 404 connects with odd row line 411. Pixel 405 connects with odd row line 413.

Pixel 406 connects with odd row line 415. As can be seen from FIG. 5, all six pixels connects with a single column line 410. Row lines (411, 412, 413, 414, 415, 416) are conventionally formed of doped polysilicon, metals; such as tungsten, titanium, titanium nitride; and refractory metal silicides; such as tungsten silicide, titanium silicide, tantalum silicide or cobalt silicide and mixtures thereof. The column line (410) is formed of a metal layer. By eliminating half of the sensor array metal layer column lines, as shown in FIG. 6, the overall size of the CMOS imager device can be reduced and/or the size of the photosensitive area can be increased.

Figure 1:
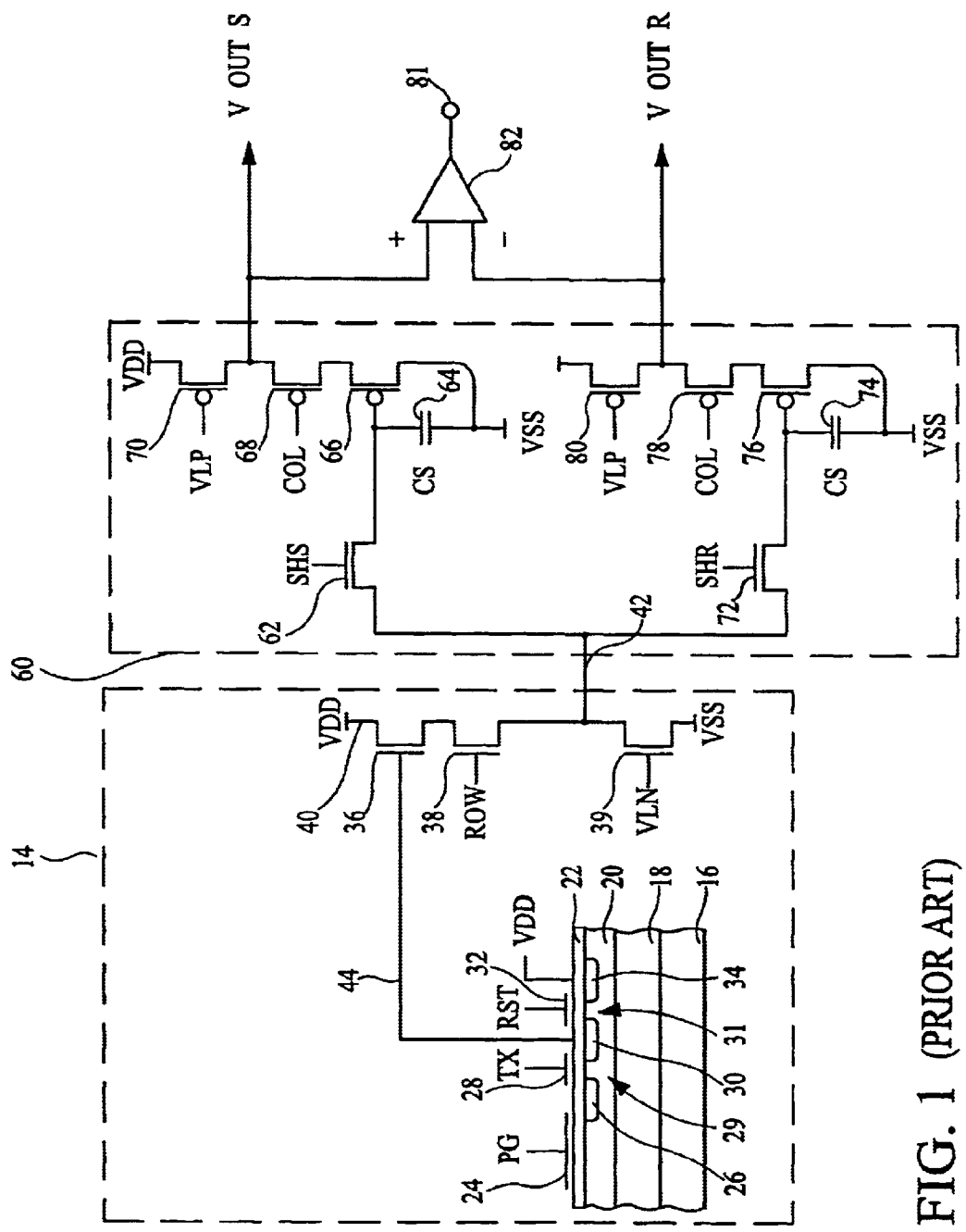
FIG. 1 is a representative circuit of a CMOS imager.
Figure 2:
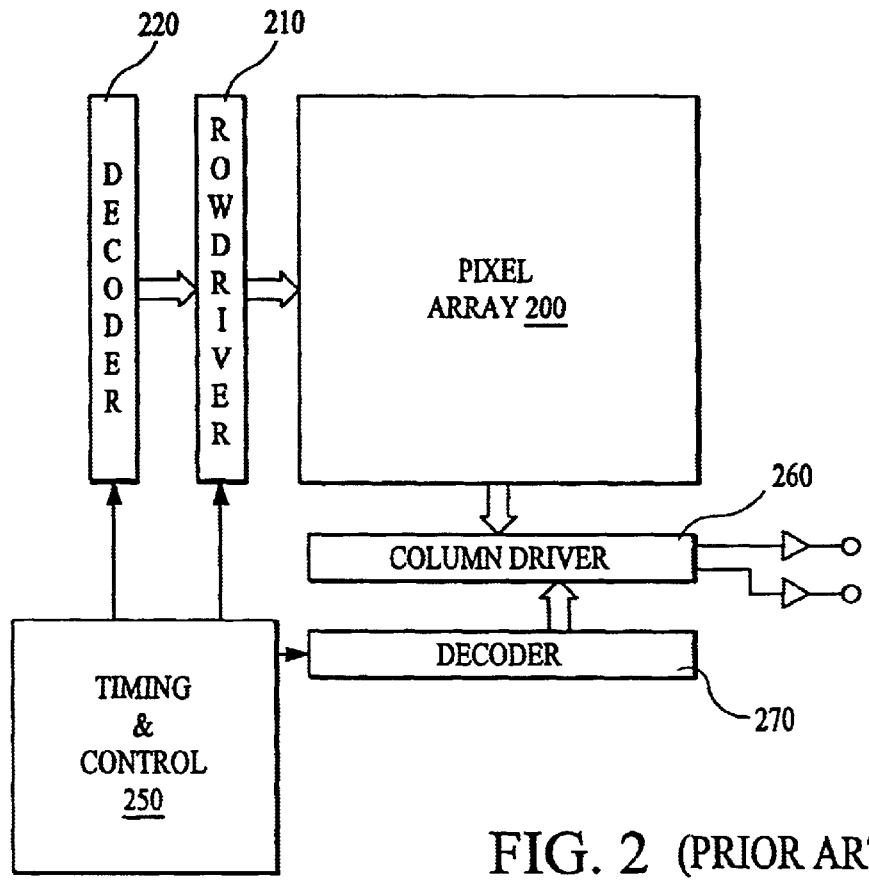
FIG. 2 is a block diagram of a CMOS active pixel sensor chip.
Figure 3:
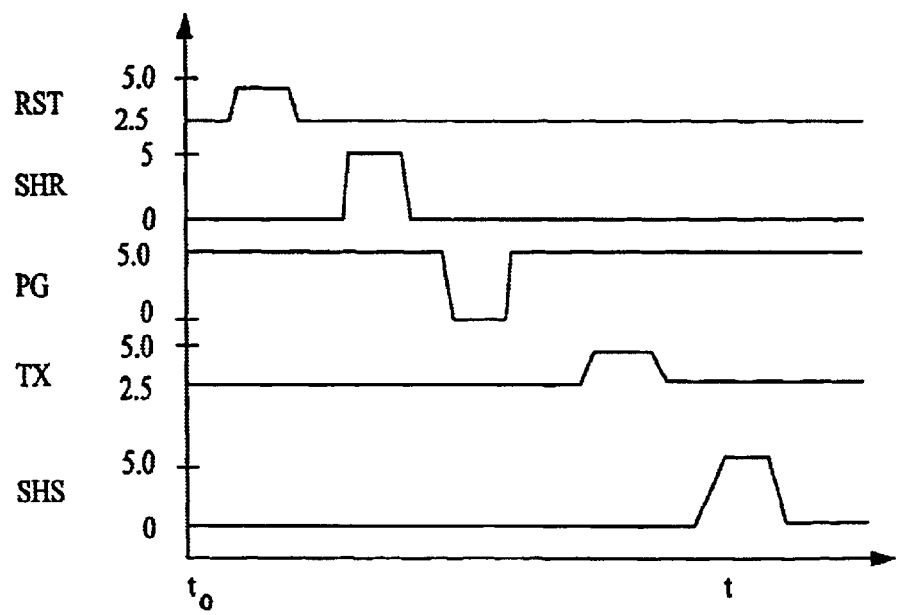
FIG. 3 is a representative timing diagram for the CMOS imager.
Figure 6:
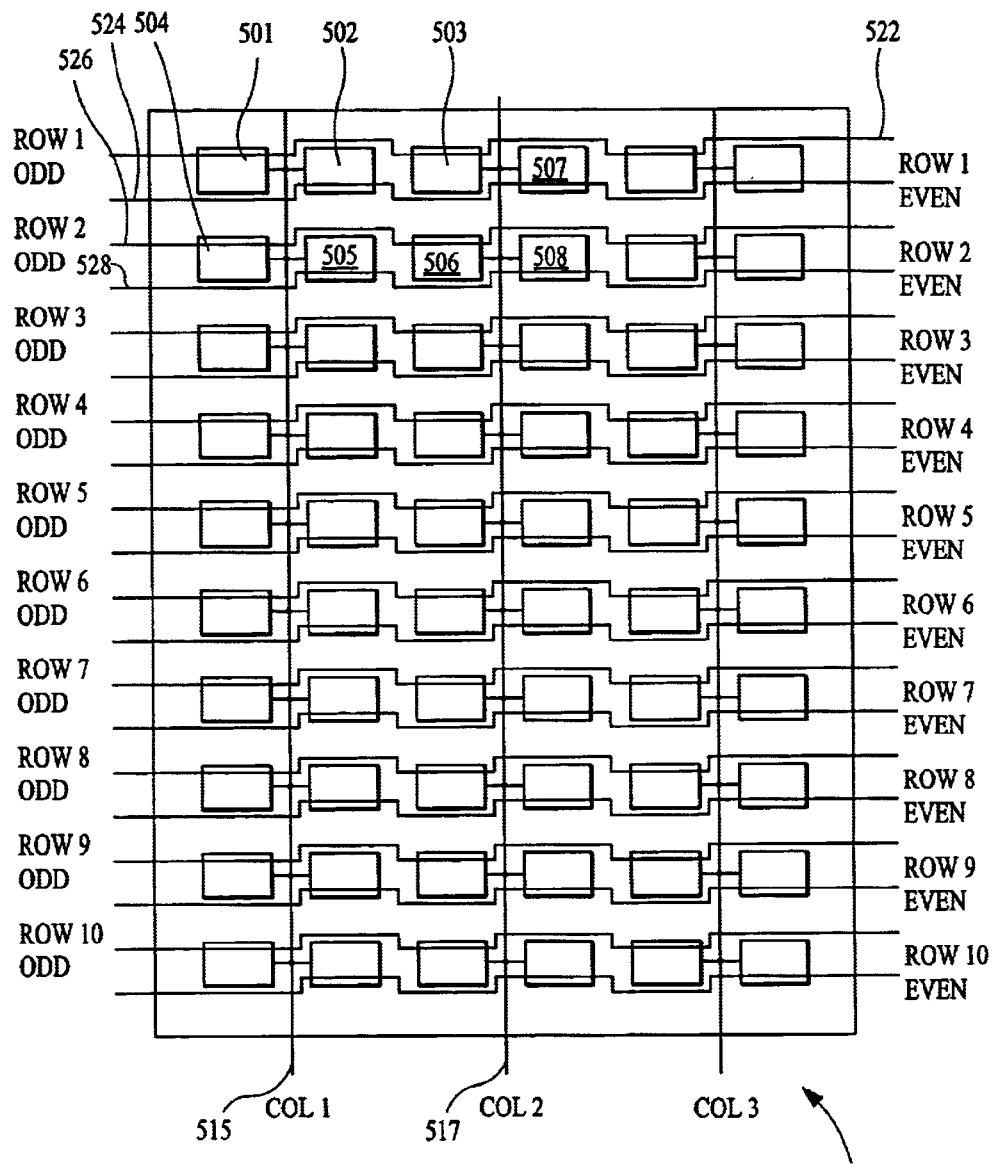
FIG. 6 is a representative layout of a CMOS array according to the present invention showing two rows of pixels sharing a single column line.

FIG. 6 shows a plurality of pixels (501, 502, 503, 504, 505, 506, 507, 508) located in an array 500. It should be understood that the labeled pixels of FIG. 6 generally function similar to the pixels previously described with respect to FIG. 1. Pixels 501, 502, 504 and 505 are connected by a shared column line 515. Pixels 503, 506, 507 and 508, for example, are connected to a second shared column line 517. Although pixels 501, 502, 504 and 505 are addressed using a single column line 515, pixel 501 is addressed by odd row line 522, and pixel 502 is addressed by even row line 524, pixel 504 is addressed by odd row line 526 and pixel 505 is addressed by even row line 528. Thus, even though adjacent row pixels, e.g., 501, 502 share a single column line, e.g., 515 their addresses are not identical.

Figure 7:
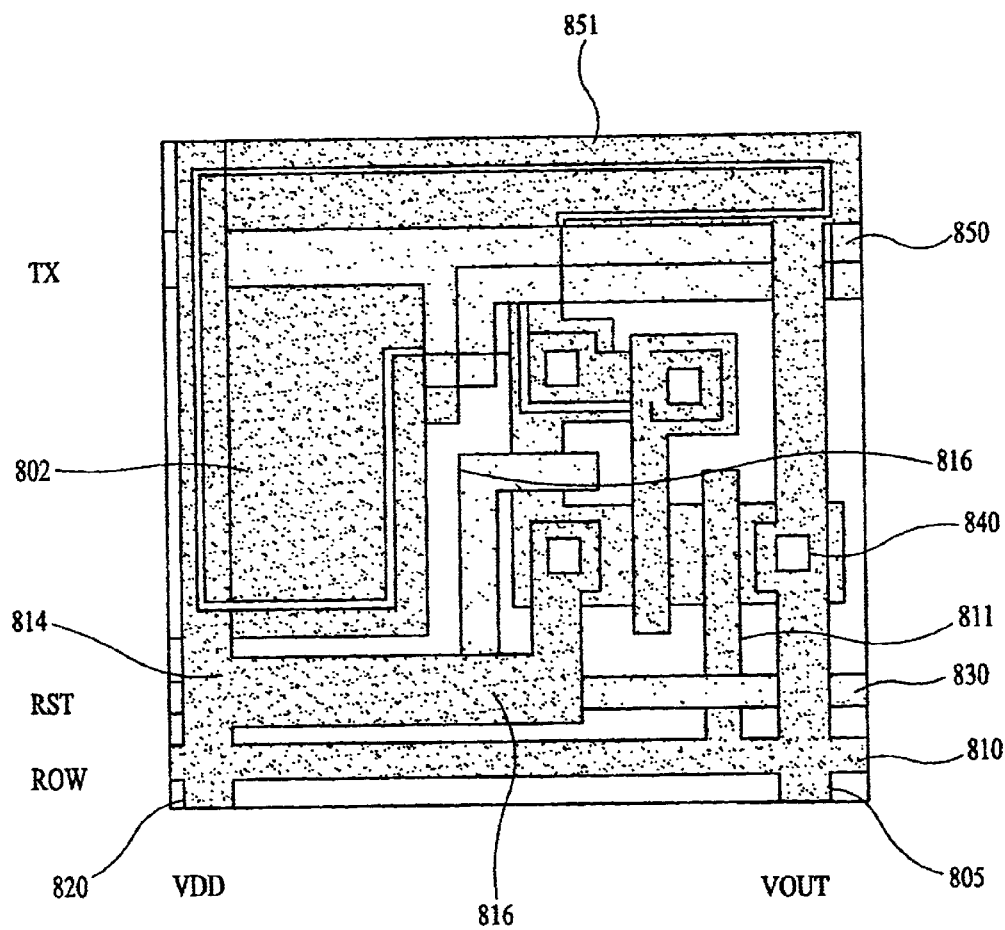
FIG. 7 is a layout illustrating a prior CMOS imager.

When the active area is fabricated to be generally linear, the prior art imagers needed to fabricate the output, VDD, reset, and row select lines in the device in a non-linear configuration with conductors having perpendicular segments, as shown in FIG. 7. As can be seen from the figure, the pixel cell includes an active area 802 having a general L-shape. Every pixel cell includes a single column line 805 where the voltage of the pixel cell is output to the readout circuit via metal connection 840. As can be seen from the figure, transfer line 850 and row line 810 each have a perpendicular segments, 851 and 811 respectively, in order to effectively connect and operate the pixel cell. The pixel cell also has a reset line 830 which has two perpendicular segments 816. The cell is connected to VDD by line 820.

Figure 8:
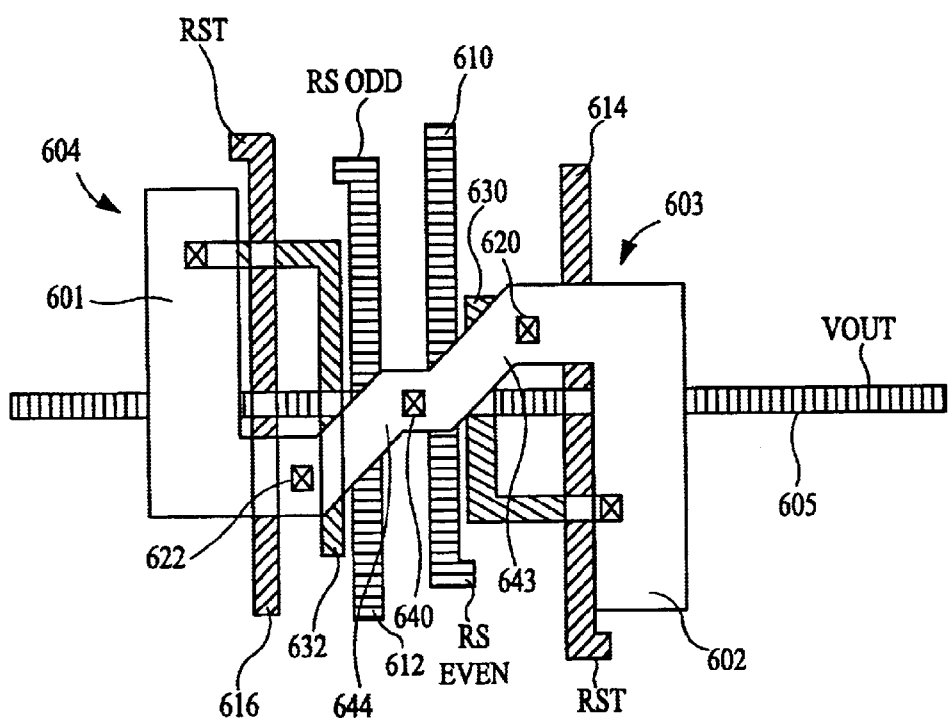
FIG. 8 is a layout illustrating a CMOS imager of the present invention having a diagonal active area.

FIG. 8 is a layout in accordance with the invention illustrating a CMOS imager having a diagonal active area component 643, 644 and linear and orthogonal row 610, 612 and column 605 lines and linear reset lines 614, 616 which parallel the row lines. By fabricating an active area 601, 602 having a diagonal component 643, 644, the present invention allows the fabrication of straight reset, row select, VDD and Vout column lines. The diagonal fabrication of the active area also facilitates the connection of two cells to a single shared column line, which reduces the number of column contacts over the prior arrays.

As illustrated in FIG. 8, a straight column line 605 connects two CMOS imager cells 603, 604 at connection point 640. The first cell 603 has an active area (sensor area) 602 which includes a diagonal component 643. The row select transistor of the first cell 603 is addressed by even row select line 610. The cell reset 603 is activated by reset line 614. The gate of the source follower transistor is connected by line 630. The cell 603 is connected to VDD by contact 620.

The second cell 604 has an active area (sensor area) 601 which includes a diagonal component 644. The row select transistor of the second cell 604 is addressed by odd row select line 612. The reset transistor of cell 604 is activated by reset line 616. The gate of the source follower transistor is connected to logic by line 632. The cell 604 is connected to VDD by contact 622. As illustrated in the figure, the row select lines 610, 612 and the reset lines 614, 616 are patterned to be straight. Additionally, the column line 605 is also straight and the two cells 603, 604 are connected to the single column line 605. The active areas 601, 602 when top viewed as in FIG. 8 for a general S-shaped configuration.

The use of a diagonal active area for the pixel allows better contact between the pixel and the associated circuit logic because the chance of forming improper contacts during fabrication is reduced with a straight line. Additionally, the diagonal active area displaces the column line contact from the VDD contacts so that the metal lines can be straight. The diagonal active area also facilitates the sharing of a single column line by adjacent row pixels.

Figure 9:
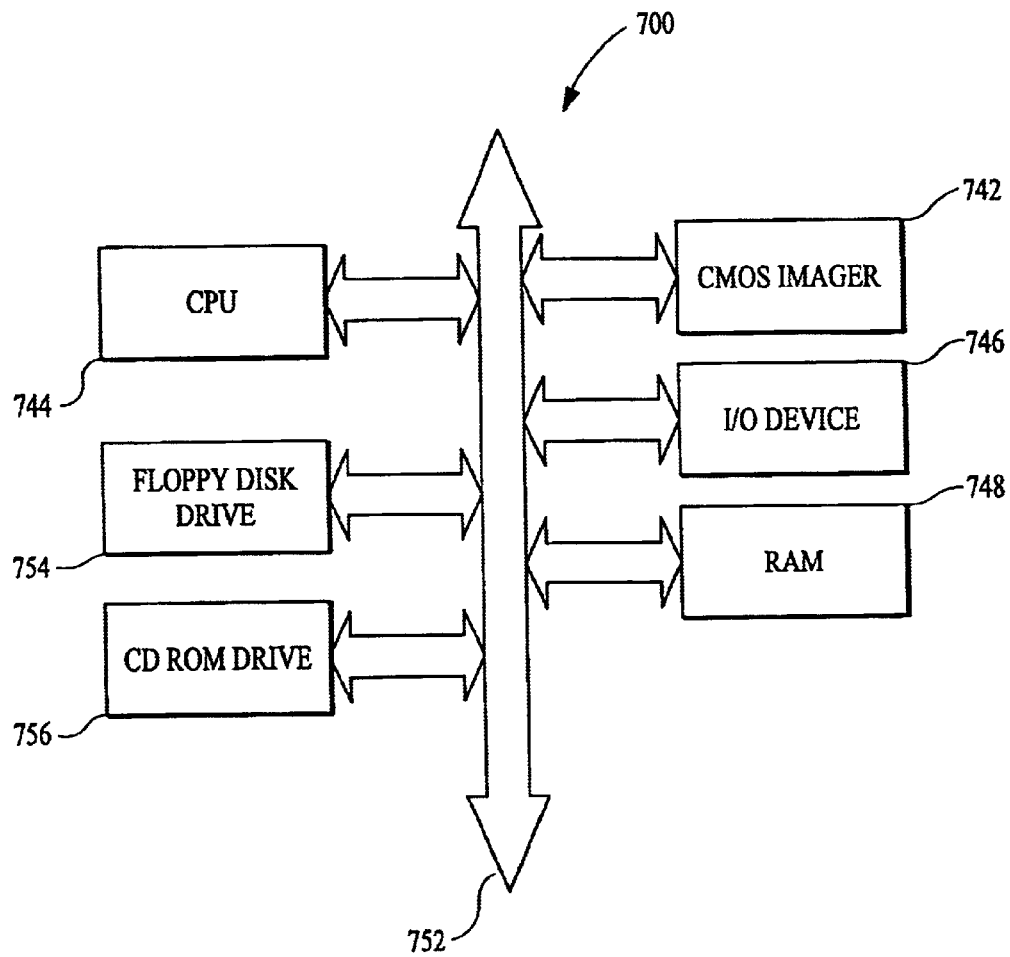
FIG. 9 is an illustration of a computer system having a CMOS imager according to the present invention.

A typical processor based system which includes a CMOS imager device according to the present invention is illustrated generally at 700 in FIG. 9. A processor based system is exemplary of a system having digital circuits which could include CMOS imager devices. Without being limiting, such a system could include a computer system, camera system, scanner, machine vision system, vehicle navigation system, video telephone system, surveillance system, auto focus system, star tracker system, motion detection system, image stabilization system and data compression system for high-definition television, all of which can utilize the present invention.

A processor system, such as a computer system, for example generally comprises a central processing unit (CPU) 744 e.g., a microprocessor, that communicates with an input/output (I/O) device 446 over a bus 752. The CMOS imager 742 also communicates with the system over bus 752. The CMOS imager 742 may be combined with a processor, such as a CPU 744, a digital signal processor or microprocessor, in a single integrated circuit.

The computer system 700 also includes random access memory (RAM) 748, and, in the case of a computer system may include peripheral devices such as a floppy disk drive 754 and a compact disk (CD) ROM drive 756 which also communicate with CPU 744 over the bus 752. CMOS imager 742 is preferably constructed as an integrated circuit which includes an integrated circuit as previously described with respect to FIGS. 5–6 and 8.

It should again be noted that although the invention has been described with specific reference to specific CMOS circuits having a single column line and even and odd row lines, the invention has broader applicability and may be used in any imaging apparatus. For example, the invention is not limited to the diagonal active area implementation. Any physical arrangement of adjacent pixels which allows adjacent multiple cells to contact a single column line is within the scope of the present invention. Similarly, the process described above is but one method of many that could be used. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. An imaging device formed as an integrated circuit comprising:
   a photosensitive device for accumulating photo-generated charge having a generally diagonally shaped component contacting a column output line in an underlying portion of a semiconductor substrate; and a readout circuit comprising at least an output transistor;
wherein said imaging device is in a row of similar imaging devices in an array and shares said column output line with an adjacent imaging device of the row.

2. The imaging device according to claim 1, wherein said photosensitive device is selected from the group consisting of a photogate, a photodiode and a photoconductor.

3. The imaging device according to claim 1, wherein said photosensitive device includes a photodiode.

4. The imaging device according to claim 1, wherein said photosensitive device includes a photoconductor.

5. The imaging device according to claim 1, further comprising a controllable charge transfer region having a control terminal, said transfer region being formed in said substrate adjacent said photosensitive area and having a node connected to a gate of said output transistor and at least one charge transfer device for transferring charge from said photosensitive area to said node in accordance with a control signal applied to said control terminal.

6. The imaging device according to claim 5, wherein said charge transfer device is a field effect transistor.

7. The imaging device according to claim 1, further comprising a straight column line formed of a metal layer in an integrated circuit to address said imaging device.

8. The imaging device according to claim 5, further comprising a reset transistor for resetting said node in response to a reset signal.

9. The imaging device according to claim 8, wherein said reset transistor is addressed by a reset line which is linear in said substrate.

10. The imaging device according to claim 9, wherein said reset line is formed of a material selected from the group consisting of doped polysilicon, metals and refractory metal silicides.

11. The imaging device according to claim 9, further comprising a row select transistor responsive to a row select signal to activate said imaging device.

12. The imaging device according to claim 11, wherein said row select transistor is addressed by a row select line which is linear in said substrate.

13. The imaging device according to claim 12, wherein said row select line is formed of a material selected from the group consisting of doped polysilicon, refractory metal silicides and mixtures thereof.

14. A method for generating an output signal corresponding to an image focused on a sensor array having rows and columns of pixel sensors on a substrate wherein two adjacent pixel sensors in a row are connected to a shared column line, each sensor capable of collecting electrical charge based on a detected light intensity, the method comprising the steps of:
   activating a first sensor in a row connected to a shared column line for a first period of time then subsequently activating an adjacent second sensors sensor in the row connected to said shared column line for a second period of time;
   detecting a first voltage at a node of a respective activated sensor;
   resetting the voltage of the respective nodes of said activated sensors to a predetermined voltage, wherein said voltage is reset by a reset transistor addressed by a reset line which is linear in said substrate;
   transferring electrical charges collected by said activated sensor to said node;
   detecting a second voltage at said node; and
   generating an output signal over said shared column line.

15. The method for generating an output signal according to claim 14, wherein said sensor is selected from the group consisting of a photogate, a photodiode and a photoconductor.

16. The method for generating an output signal according to claim 14, wherein said node is a floating diffusion node.

17. The method for generating an output signal according to claim 14, wherein said shared column line is formed of a metal layer.

18. The method for generating an output signal according to claim 14, wherein said shared column line is linear in said substrate.

19. The method for generating an output signal according to claim 14, wherein said reset transistor is addressed by a reset line which is linear in said substrate.

20. The method for generating an output signal according to claim 19, wherein said reset line is formed of a material selected from the group consisting of doped polysilicon, metals, refractory metal suicides and mixtures thereof.

21. The method for generating an output signal according to claim 14, wherein said row select transistor is addressed by a row select line which is linear in said substrate.

22. The method for generating an output signal according to claim 21, wherein said row select line is formed of a material selected from the group consisting of doped polysilicon, metals, refractory metal silicides and mixtures thereof.

23. An imaging system comprising:
   a plurality of pixel cells having an active sensor area which includes a diagonally shaped component, the cells being arranged into an array of rows and columns, each pixel cell being operable to generate a voltage at a diffusion node corresponding to detected light intensity by the sensor, wherein two cells in a row share a common column line for addressing said pixel cell and the pixel cells in the row that share the common column line are alternatively addressed by respective row select lines;
   a row select device connected to either an odd row select line or an even row select line respectively; and
   a row decoder having a plurality of control lines connected to the pixel cells, each control line being connected to the cells in contact with a respective column, wherein the row decoder is operable to activate odd cells in said rows and even cells in said rows by said row select device.

24. The imaging system according to claim 23, further comprising:
   a reset device to reset the voltage of a diffusion node formed in the cells;
   a transfer device to transfer charge from said pixel cells to said diffusion node; and
   a plurality of output circuits respectively connected to a pixel cell, each output circuit being operable to store a voltage signal received from a respective pixel cell and to provide a sensor output signal.

25. The imaging system according to claim 23, wherein said pixel cells include a photogate, a photodiode or a photoconductor in said active area.

26. The imaging system according to claim 24, wherein the diffusion node is a floating diffusion node.

27. The imaging system according to claim 23, wherein said column line addressing two adjacent rows of pixel cells is linear in said substrate.

28. The imaging device according to claim 27, wherein said column line is formed of a metal.

29. The imaging system according to claim 24, wherein said reset device is addressed by a reset line which is linear in said substrate.

30. The imaging system according to claim 29, wherein said reset line is formed of a material selected from the group consisting of doped polysilicon, metals, refractory metal silicides and mixtures thereof.

31. The imaging system according to claim 24, wherein said row select device is addressed by a row select line which is linear in said substrate.

32. The imaging system according to claim 31, wherein said row select line is formed of a material selected from the group consisting of doped polysilicon, metals, refractory metal silicides and mixtures thereof.

33. A CMOS imager array comprising:
 a plurality of CMOS imager pixels for generating an output signal from detected light and arranged in rows and columns in an array;
 a plurality of column lines each connected to at least two adjacent pixels of a row in said array, said column lines being connected to output circuitry to output signals generated from detected light;
 a plurality of odd row select lines orthogonal to said column lines to address odd pixels in said rows;
 a plurality of even row select lines orthogonal to said column lines to address even pixels in said rows;
 column drivers to address the pixels connected to said column lines;
 row drivers to address the pixels through said odd row lines and said even row lines.

34. The CMOS imager array according to claim 33, wherein said plurality of CMOS imager pixels have an active area having a diagonally shaped component.

35. The CMOS imager array according to claim 33, wherein said column line is linear in said array.

36. The CMOS imager array according to claim 34, wherein said column line is formed of a metal.

37. The CMOS imager array according to claim 33, wherein said odd row lines and said even row lines are is linear in said array.

38. The CMOS imager array according to claim 36, wherein said odd and even row select lines are formed of materials selected from the group consisting of doped polysilicon, metals, refractory metal silicides and mixtures thereof.

39. A system comprising:
 (i) a processor; and
 (ii) a CMOS imaging device coupled to said processor and including:
  a photosensitive device for accumulating photo-generated charge in an underlying portion of a semiconductor substrate, wherein the photosensitive area of said imaging devices sharing a column line is generally S-shaped; and
  a readout circuit comprising at least an output transistor;
  wherein said imaging device is in a row of similar imaging devices in an array and shares a column output line with an adjacent imaging device of the row.

40. The system according to claim 39, wherein said photosensitive device selected from the group consisting of a photogate, a photodiode and a photoconductor.

41. The system according to claim 39, wherein said photosensitive device includes an active area for accumulating photo-generated charge having a generally diagonally shaped component.

42. The system according to claim 39, further comprising a controllable charge transfer region having a control terminal, said transfer region being formed in said substrate adjacent said photosensitive area and having a node connected to a gate of said output transistor and at least one charge transfer device for transferring charge from said photosensitive area to said node in accordance with a control signal applied to said control terminal.

43. The system according to claim 42, wherein said charge transfer device is a field effect transistor.

44. The system according to claim 39, further comprising a straight column line formed of a metal layer in a substrate to address said imaging device.

45. The system according to claim 42, further comprising a reset transistor for resetting said node in response to a reset signal.

46. The system according to claim 45, wherein said reset transistor is addressed by a reset line which is linear in said substrate.

47. The system according to claim 46, wherein said reset line is formed of a material selected from the group consisting of doped polysilicon, metals, refractory metal silicides and mixtures thereof.

48. The system according to claim 46, further comprising a row select transistor responsive to a row select signal to activate said imaging device.

49. The system according to claim 48, wherein said row select transistor is addressed by a row select line which is linear in said substrate.

50. The system according to claim 49, wherein said row select line is formed of a material selected from the group consisting of doped polysilicon, metals, refractory metal silicides and mixtures thereof.

51. The system according to claim 39, wherein said system is a camera system.

52. The system according to claim 39, wherein said system is a scanner.

53. The system according to claim 39, wherein said system is a machine vision system.

54. The system according to claim 39, wherein said system is a vehicle navigation system.

55. The system according to claim 39, wherein said system is a video telephone system.

* * * * *

UNITED STATES PATENT AND TRADEMARK OFFICE
CERTIFICATE OF CORRECTION

PATENT NO. : 6,654,057 B1
DATED : November 25, 2003
INVENTOR(S) : Howard E. Rhodes It is certified that error appears in the above-identified patent and that said Letters Patent is hereby corrected as shown below:

Column 3,
Line 24, "photbgate" should read -- photogate --.

Column 7,
Line 2, "connects" should read -- connect --.

Signed and Sealed this

Thirteenth Day of April, 2004

JON W. DUDAS
*Acting Director of the United States Patent and Trademark Office*